United States Patent [19]

Jaeger

[11] Patent Number: 5,148,383
[45] Date of Patent: Sep. 15, 1992

[54] DIGITAL TRANSVERSAL FILTER

[75] Inventor: Kevin A. Jaeger, Glen Ellen, Calif.

[73] Assignee: AMP Incorporated, Harrisburg, Pa.

[21] Appl. No.: 631,825

[22] Filed: Dec. 21, 1990

[51] Int. Cl.$^5$ .............................................. G06F 15/31
[52] U.S. Cl. .................................................. 364/724.16
[58] Field of Search ...................... 364/724.16; 375/11, 375/14, 18, 60, 54; 455/69; 333/165

[56] References Cited

U.S. PATENT DOCUMENTS

| | | | |
|---|---|---|---|
| 3,348,153 | 10/1967 | Featherston | 375/11 |
| 3,543,009 | 11/1970 | Voelcker, Jr. | 375/11 |
| 3,793,589 | 2/1974 | Puckette | 325/137 |
| 4,323,864 | 4/1982 | Ogawa et al. | 333/165 |
| 4,568,842 | 2/1986 | Koike | 307/279 |
| 4,573,166 | 2/1986 | Frederick | 375/54 |
| 4,773,082 | 9/1988 | Somer et al. | 375/60 |

FOREIGN PATENT DOCUMENTS 0015681 9/1980 European Pat. Off. .
86/03356 6/1986 PCT Int'l Appl. .

OTHER PUBLICATIONS

*Filtering in Time and Frequency Domains*, H. J. Blinchikoff et al., (1976), pp. 18–21.
Bell System Technology Journal (Sep. 1969) "Synthesis of Pulse Shaping Networks in the Time Domain", by David A. Spaulding, pp. 2425–2444.
IEEE 802.9/105, Physical Medium (High Rate) Sub-Group IVD LAN Interface Working Group, Sep. 7, 1989, entitled: On the Selection of Line Signal Modulation; by: Chandos A. Rypinski.
IEEE 802.9/111, IVD LAN Interface Working Group, Oct. 23, 1989, entitled: Minutes of Interim Meeting Toronto, Ontario, Sep. 18–22, 1989.
IEEE 802.9/123, IVD LAN Interface Working Group, Nov. 1, 1989; entitled: Report on NRZST Line Signal Experimental Results; by: Chandos A. Rypinski.
IEEE Transactions on Communication Technology, vo. COM-16, No. 1, 1968, pp. 81–93, "Generation of Digital Signal Wave Forms", by H. B. Volker.
IEEE Transactions on Communications Technology, vol. COM-16, No. 11, 1976, pp. 1262–1268, "Transversal Filter Design and Application in Satellite Communications" by Feher and DeCristofaro.

*Primary Examiner*—Jerry Smith
*Assistant Examiner*—Chuong D. Ngo
*Attorney, Agent, or Firm*—David L. Smith

[57] ABSTRACT

A digital transversal filter includes first and second shift registers. A first digital data signal is applied as an input to the first shift register and a second digital data signal, which is a phase shifted version of the first digital data signal, is applied to the second shift register. First and second clock signals are used to clock the shift registers, and these clock signals correspond in frequency but differ in phase with respect to one another. The outputs of the stages of the first and second delay lines are weighted by respective resistors which are connected to a summing node. The digital data signal has a data clocking rate, the first and second clock signals have a delay line clocking rate, and the data clocking rate is slower than the delay line clocking rate.

19 Claims, 12 Drawing Sheets

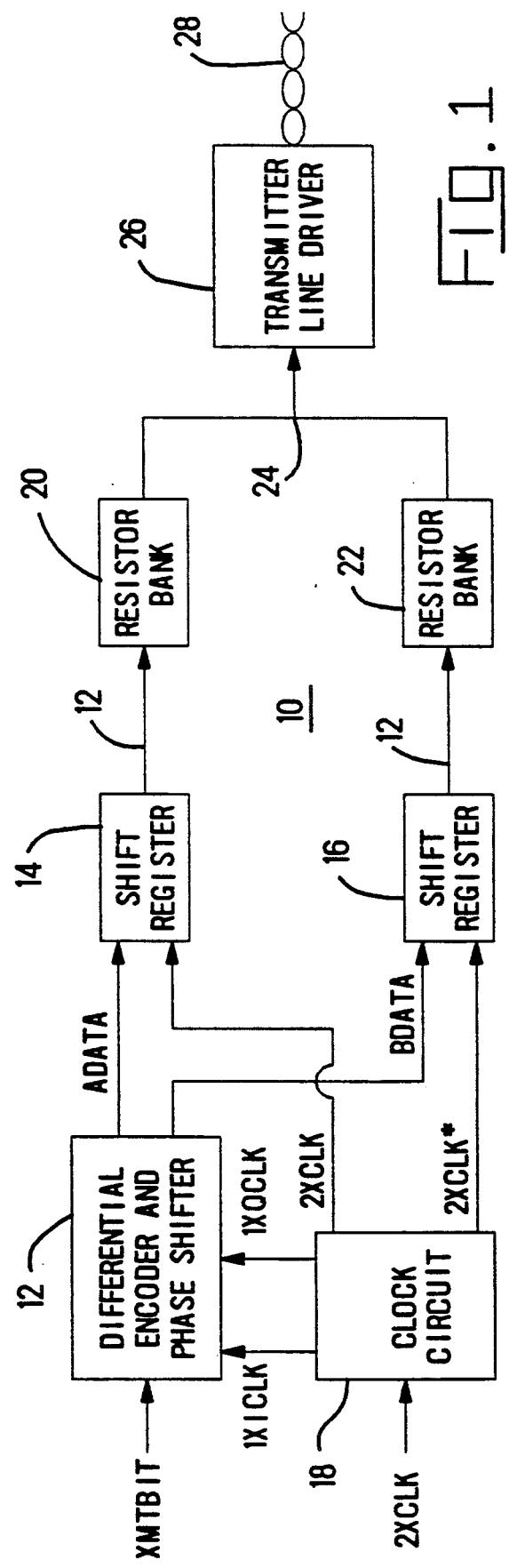

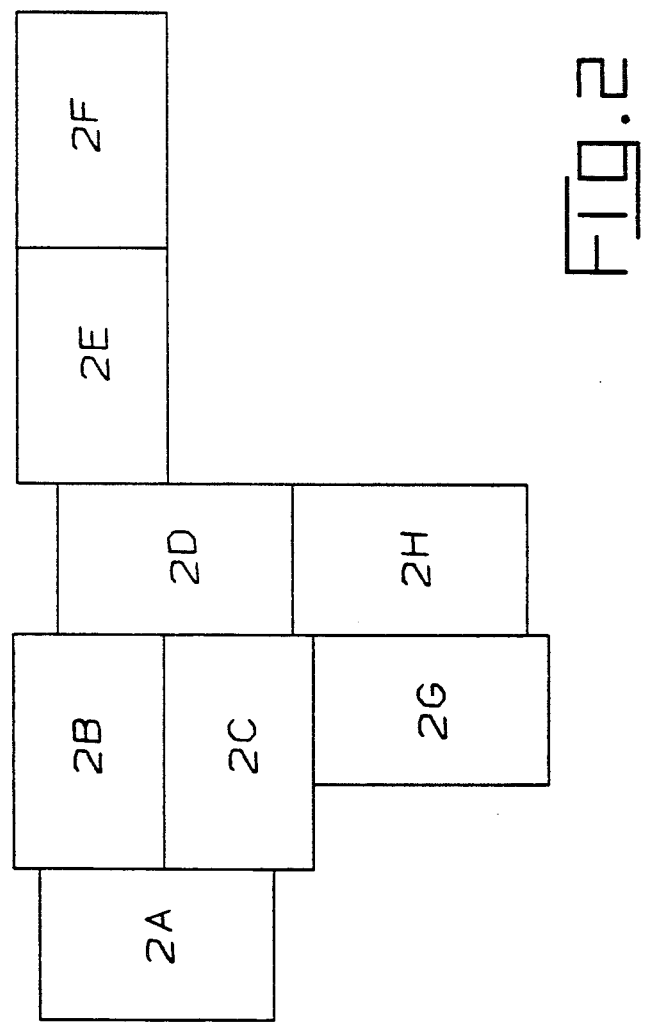

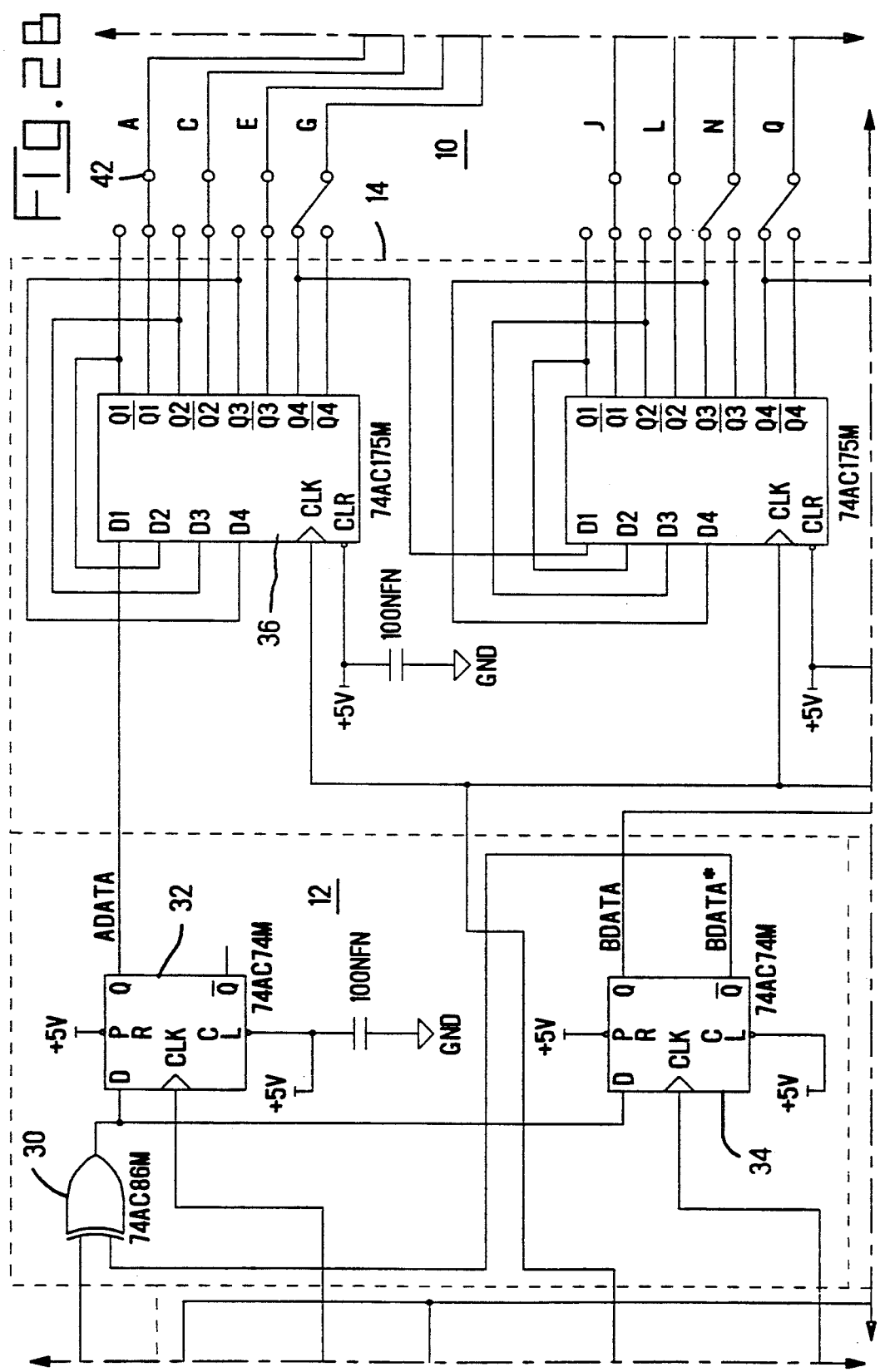

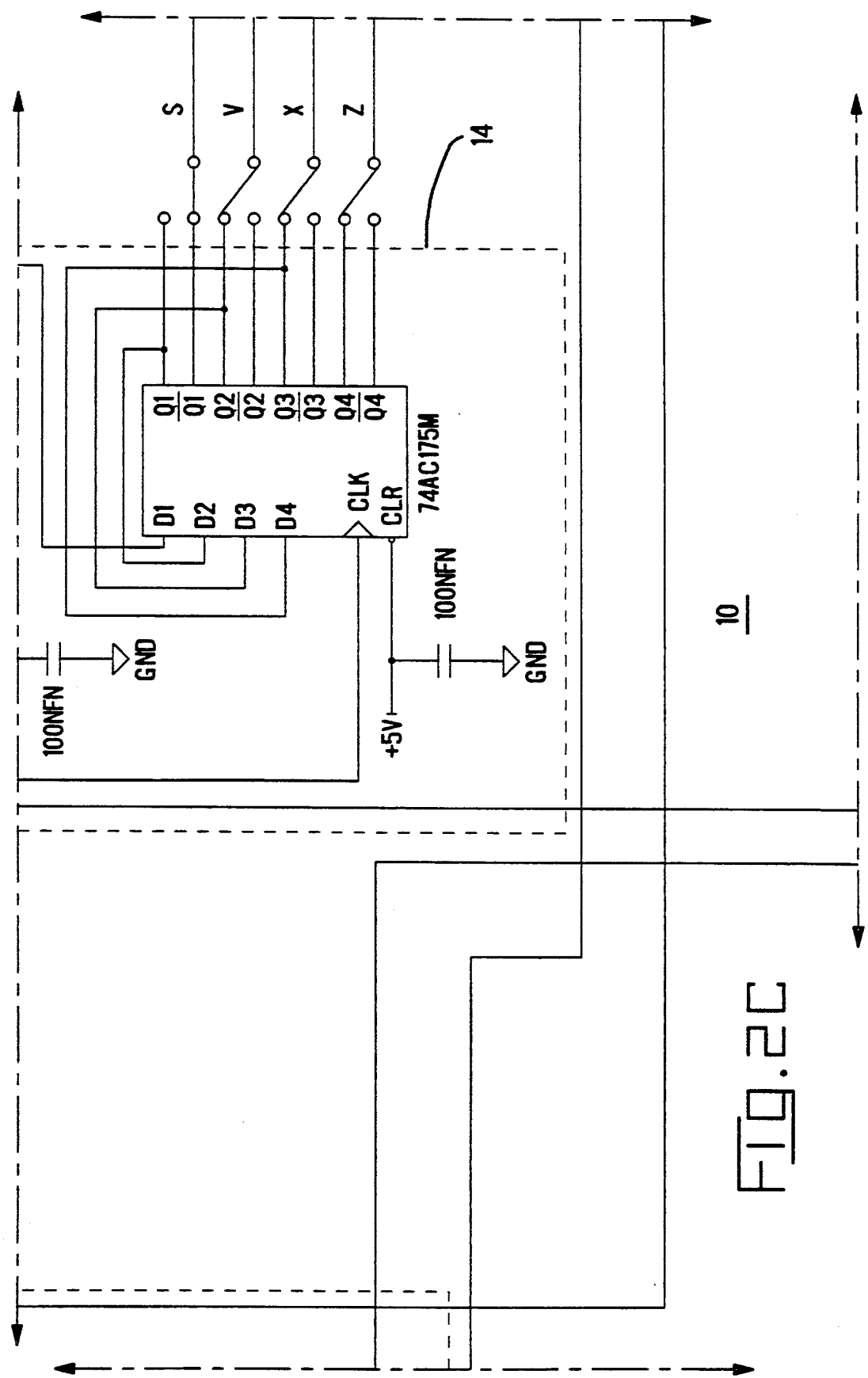

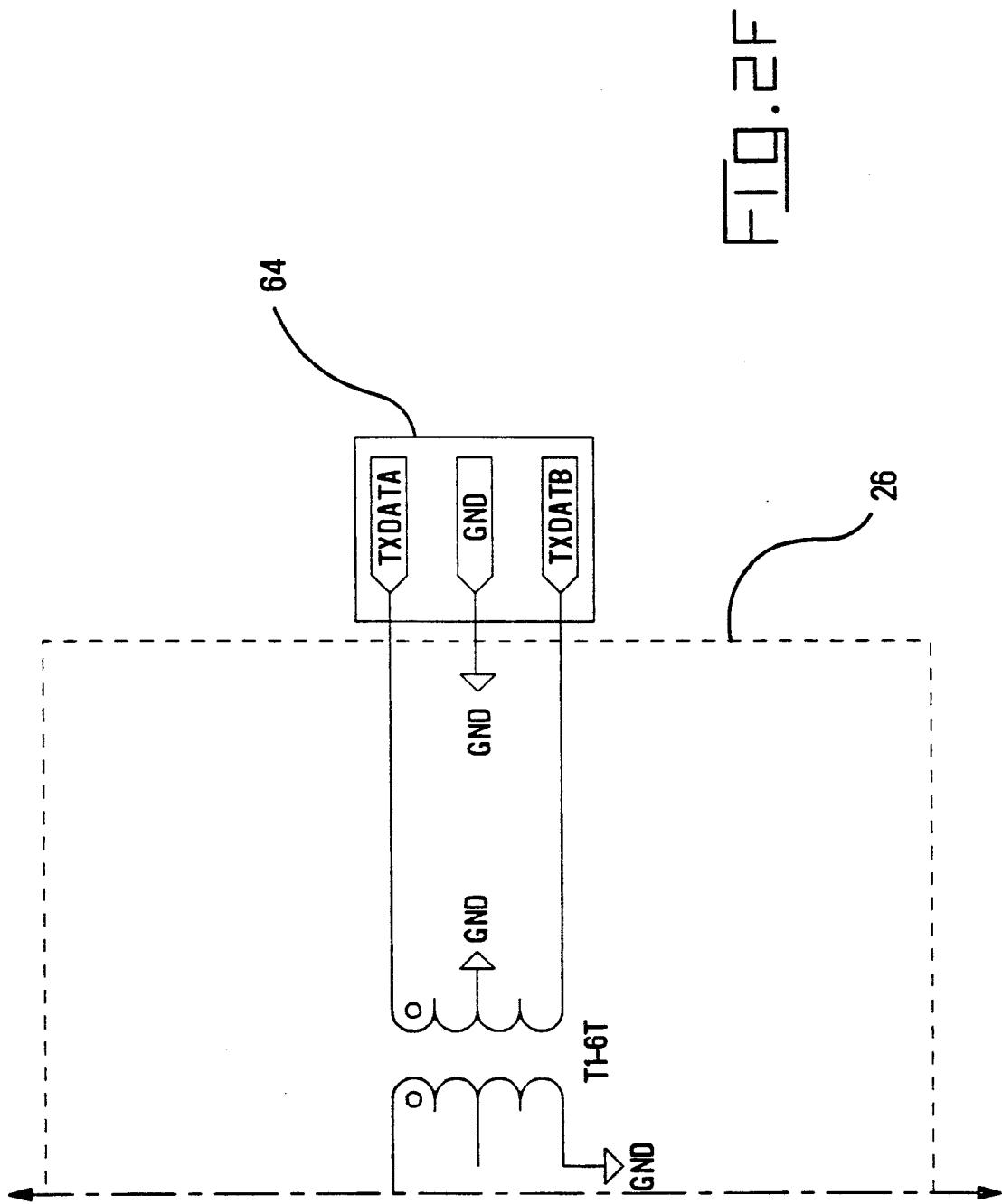

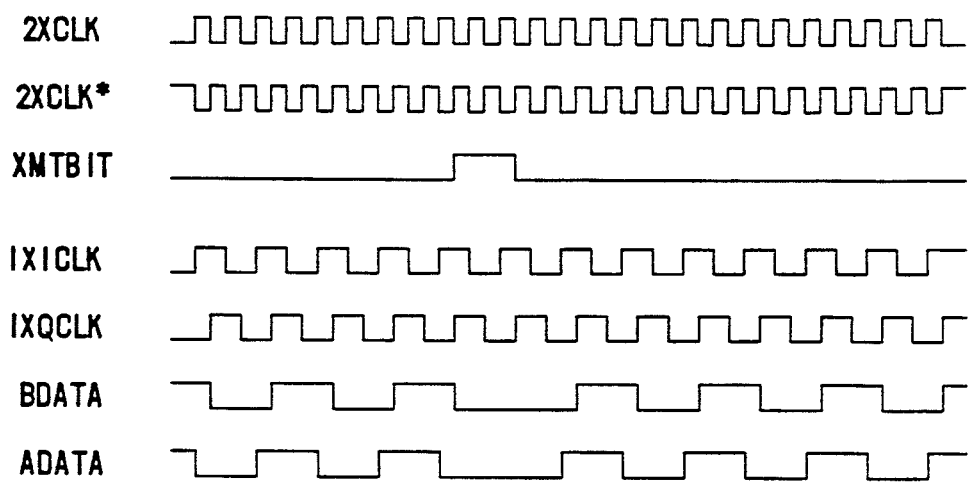
FIG.3A
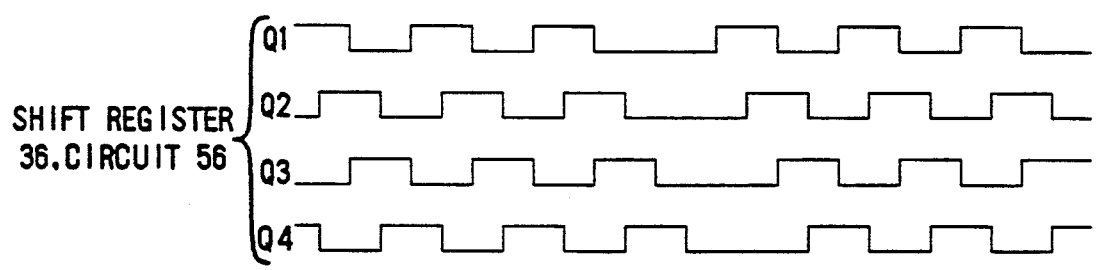
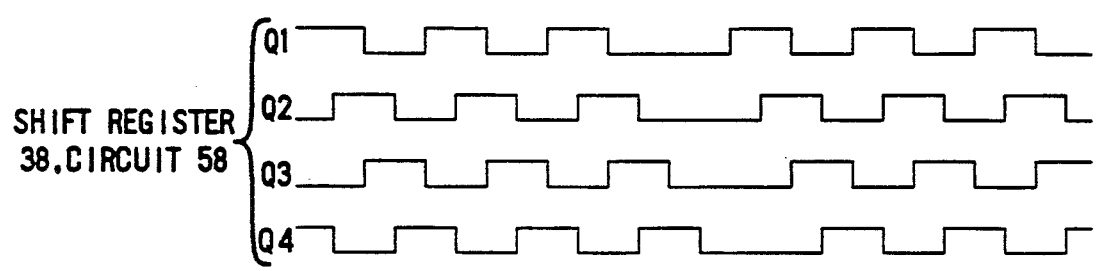
FIG.3B

DIGITAL TRANSVERSAL FILTER

CROSS REFERENCE TO RELATED APPLICATIONS

The present specification was filed on the same day as two related applications: U.S. patent application Ser. No. 632,433 and U.S. patent application Ser. No. 632,434. The entire specification of each of these related applications is hereby incorporated by reference into the present application.

BACKGROUND OF THE INVENTION

This invention relates to digital transversal filters of the type having a delay line including multiple stages which are clocked by timing signals to shift an input signal through the delay line, weighting means for weighting outputs of each of the stages of the delay line, and summing means for summing the weighted outputs of the stages of the delay line to synthesize a summed output.

Transversal filters of the general type described above are disclosed for example in Somer U.S. Pat. No. 4,773,082, assigned to the assignee of the present invention. The transversal filter of the Somer patent includes two delay lines made up of flip flops which function collectively as a shift register. As pointed out in the Somer patent, it is advantageous for many applications to have such a shift register shift multiple times per data bit. However, when the data bit is produced at a high rate, it may not be practical or economically feasible to operate the shift register at a large multiple of the frequency of the incoming data. The Somer patent addresses this problem with a shift register that is clocked at the same rate as the data, yet which shifts several times per data bit. In the particular example given in the Somer patent, the shift register shifts four times per data bit by using four clocks, each having the same frequency as the data bits, but each phase shifted by a phase angle of 90° with respect to the next adjacent clock.

It is an object of the present invention to provide a digital transversal filter which shifts multiple times per data bit, yet which requires a smaller number of separately phased clock signals for the shift register.

SUMMARY OF THE INVENTION

According to this invention a digital transversal filter is provided which comprises first and second delay lines, each having a data input terminal, a clock input terminal, and a plurality of stages which are clocked by signals applied to the clock input terminal to shift digital data through the delay line, at least selected stages of the delay line each providing a respective output. A digital data signal is applied to the data input terminal of the first delay line and a phase shifted version of the digital data signal is applied to the data input terminal of the second delay line. First and second clock signals are applied to the clock input terminals of the first and second delay lines, respectively, and these clock signals correspond in frequency but differ in phase with respect to one another. Means are provided for weighting the outputs of the stages of the first and second delay lines and means are provided for summing the weighted outputs of the stages of the first and second delay lines to synthesize the summed output. The digital data signal is characterized by a data clocking rate, the clock signals are characterized by a delay line clocking rate, and the data clocking rate is slower than the delay line clocking rate.

This invention provides the advantage of reducing the number of clock phases required to operate the delay line to achieve a given number of shifts per data bit. In the example set out below the delay line clocking rate is twice the data clocking rate, the two clocking signals are phase shifted by 180°, and the two data signals are phase shifted by 90°. With this arrangement, the delay line provides four shifts per cycle of the data signal, even though the maximum cycle rate of the delay line is only two times that of the data signal.

BRIEF DESCRIPTION OF THE DRAWINGS

FIG. 1 is a block diagram of a modem transmitter which incorporates a presently preferred embodiment of this invention;

FIG. 2 shows the layout of FIGS. 2A through 2H;

FIGS. 2A through 2H are a detailed schematic diagram of the transmitter of FIG. 1;

FIGS. 3A and 3B are timing diagrams of signals developed by the circuit of FIG. 2A through 2R.

DETAILED DESCRIPTION OF THE PRESENTLY PREFERRED EMBODIMENTS

Figure 2A:
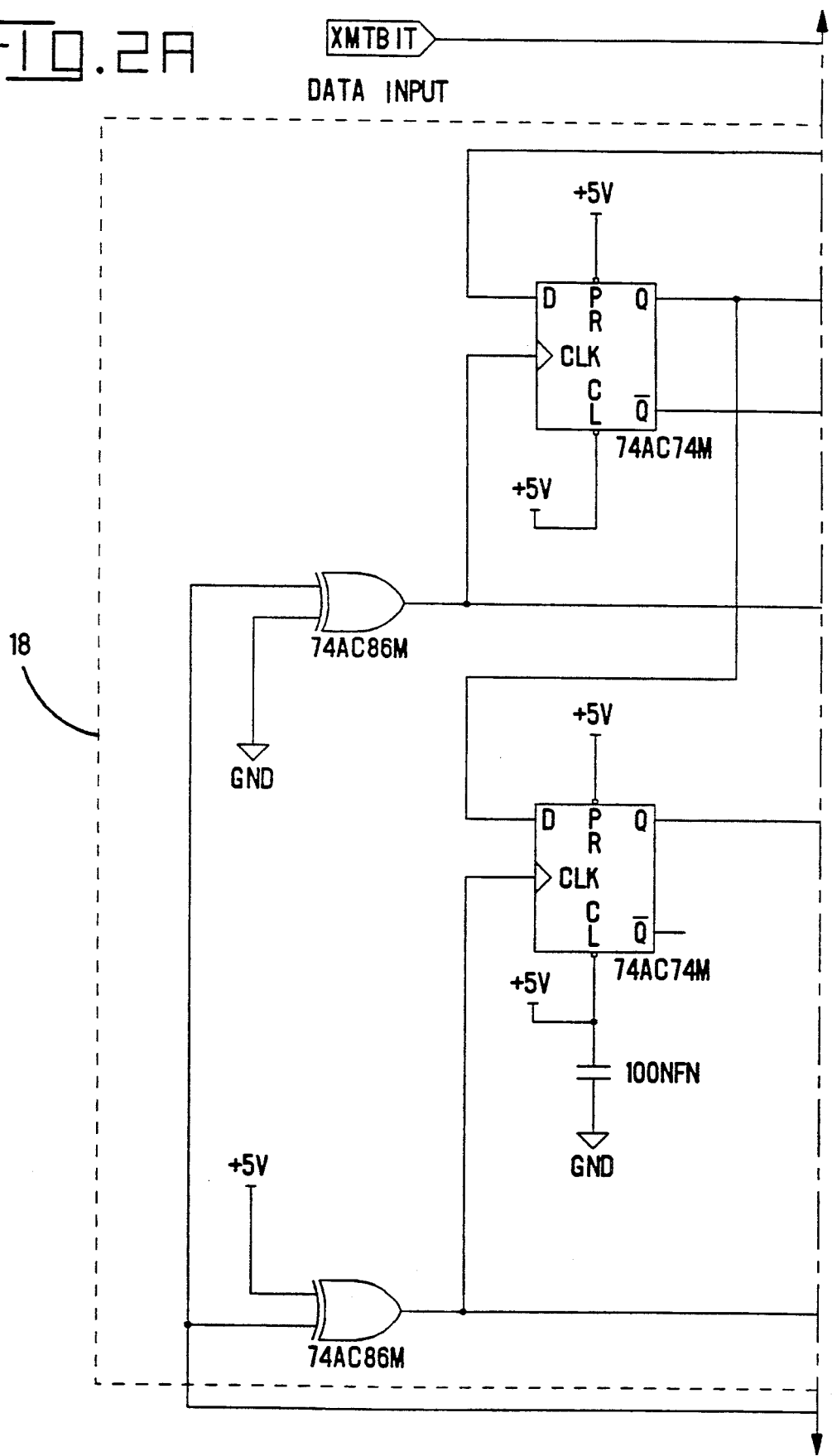
Figure 2D:
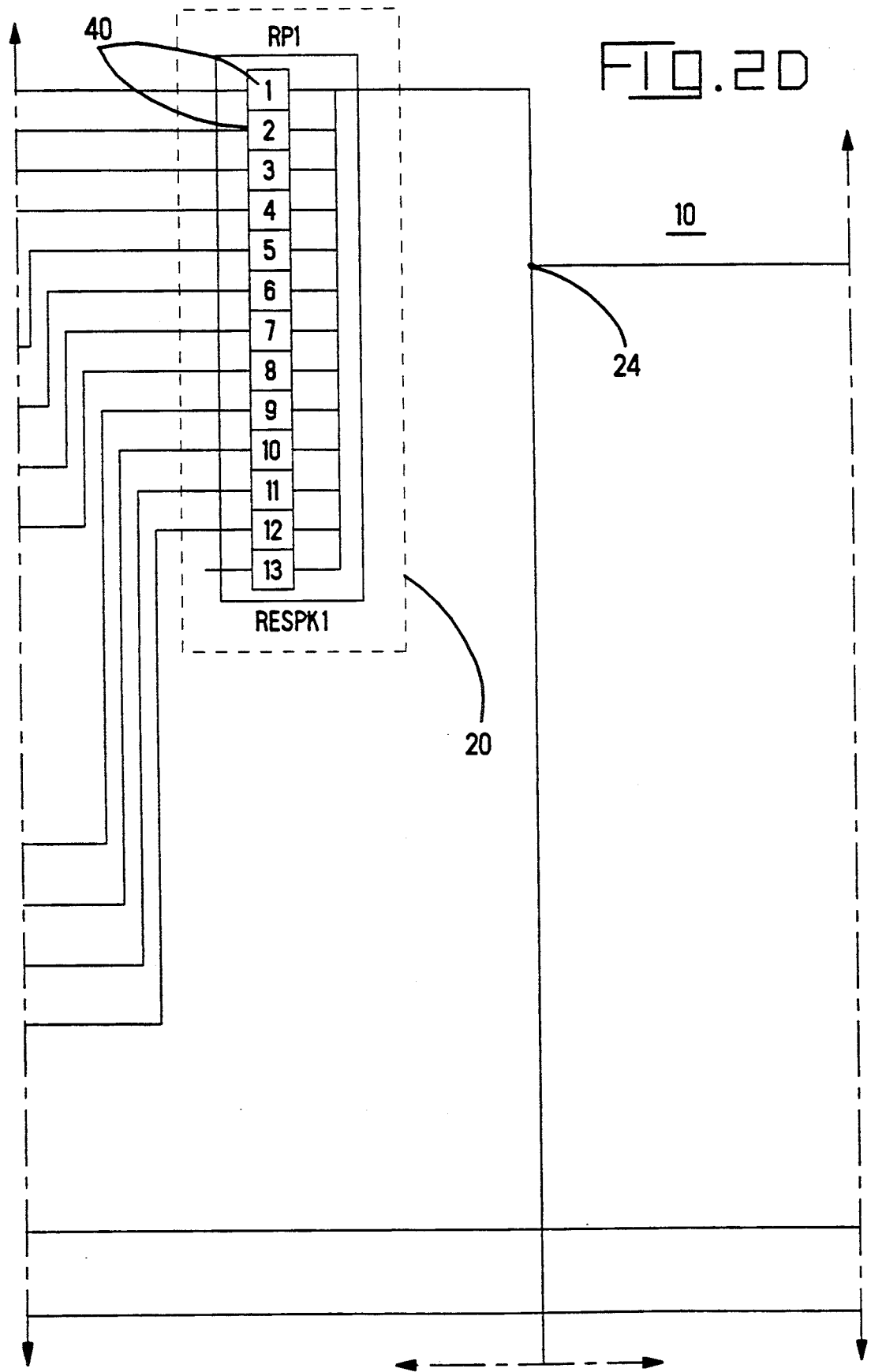
Figure 2E:
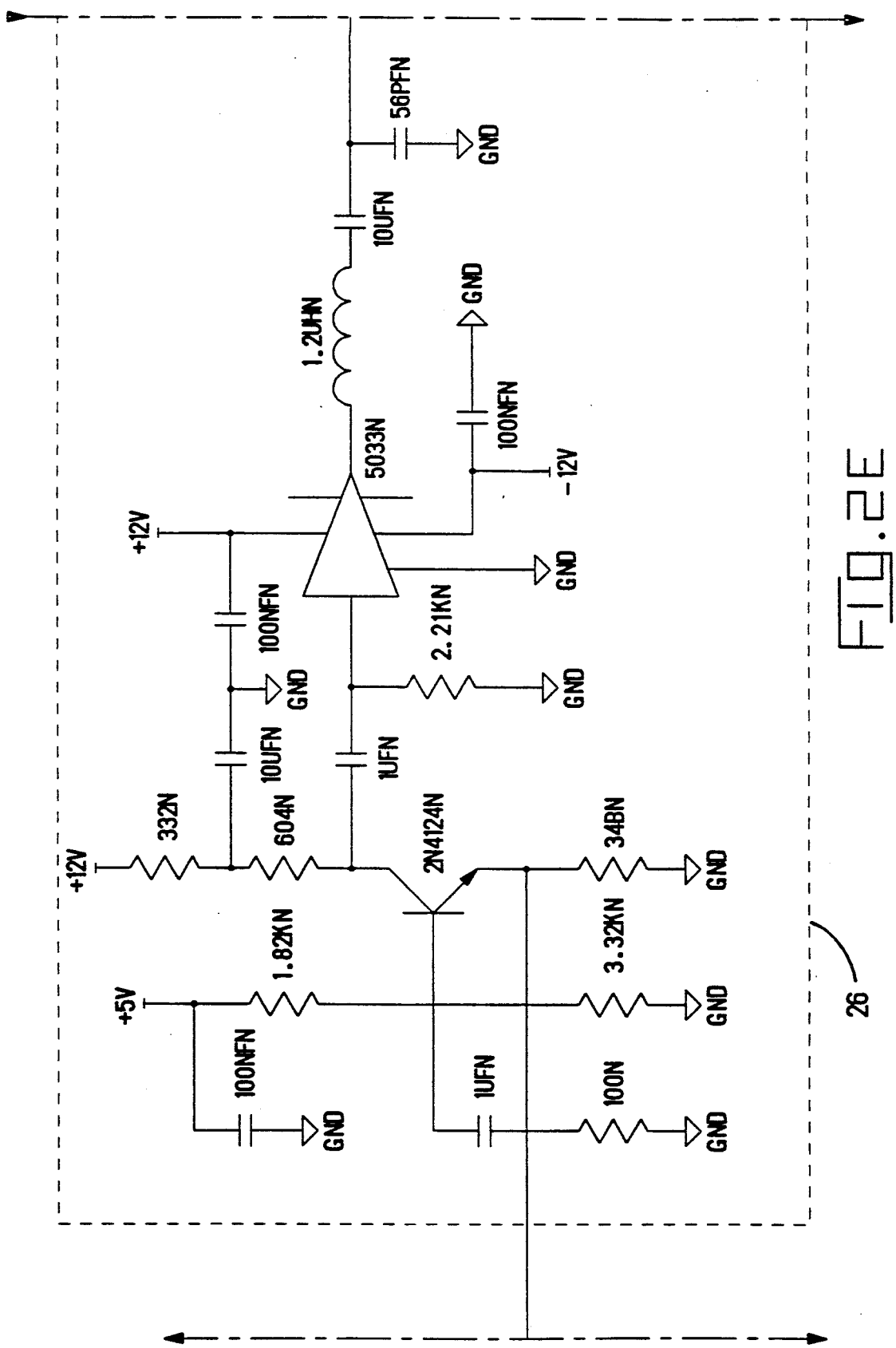
Figure 2G:
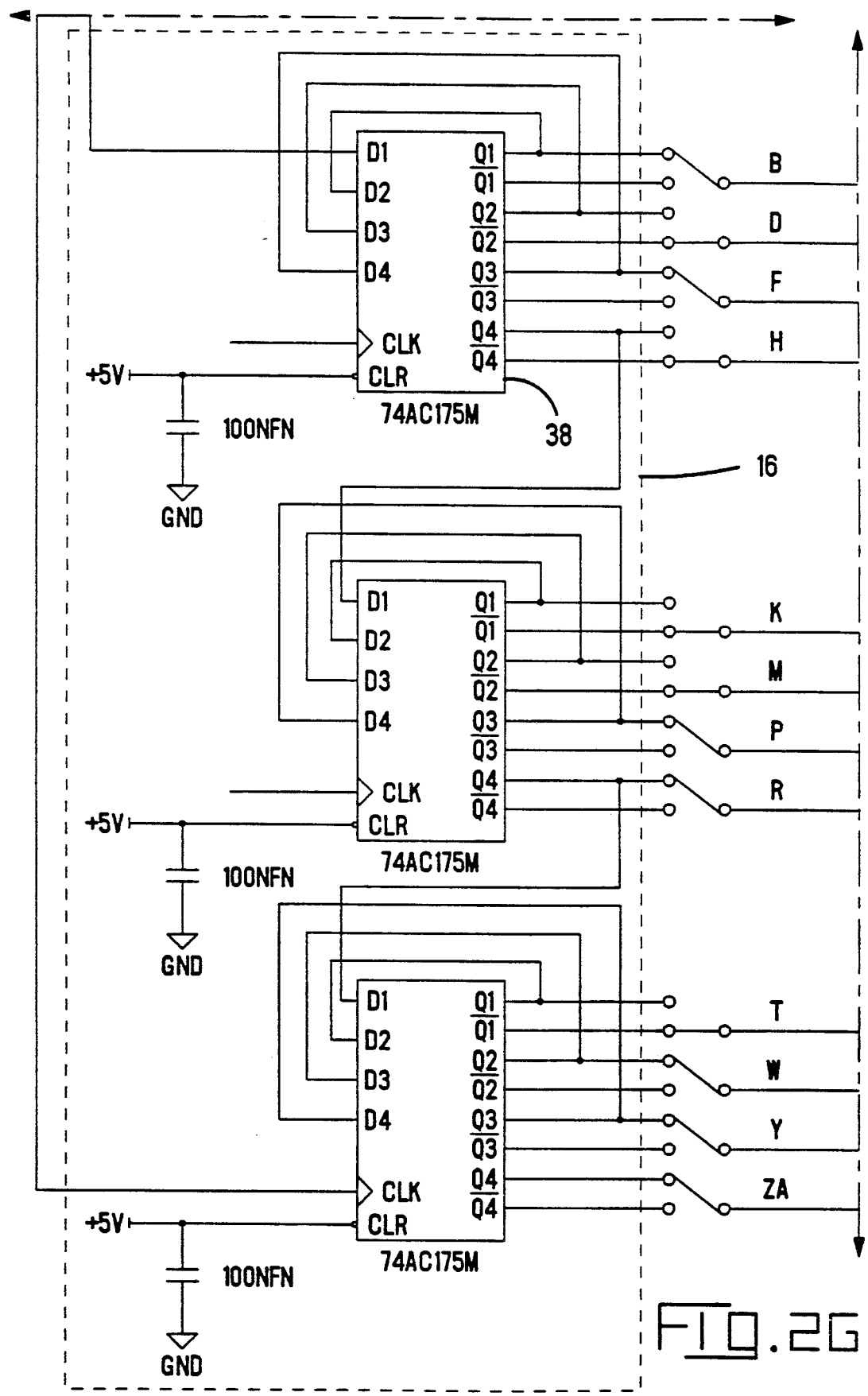
Figure 2H:
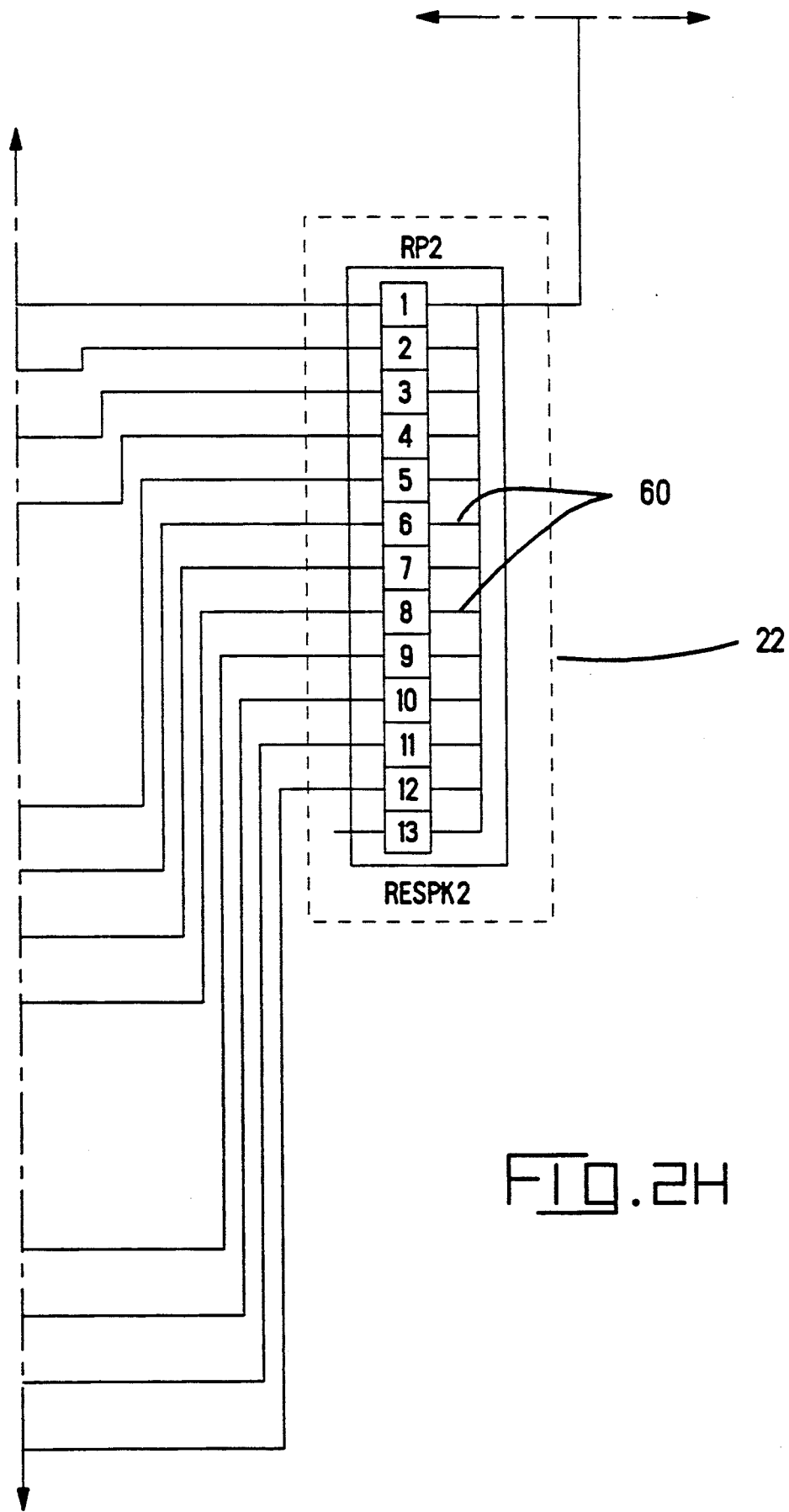

FIG. 1 shows a block diagram of a modem transmitter 10 which incorporates a presently preferred embodiment of this invention. By way of overview, the transmitter 10 uses an NRZST modulation (Non-Return to Zero with Smooth Transitions). This modulation is essentially a standard NRZ modulation where the transmitted pulse shape for a single isolated pulse covers two bit intervals and is pre-shaped in a specific way to cause smooth transitions. The transmitter 10 operates by transmitting a positive pulse for every binary 1 and a negative pulse for every binary 0.

The transmitter 10 receives a string of bits to be transmitted at the input terminal XMTBIT. This string of bits is differentially encoded and phase-shifted in a circuit 12 that generates two output signals: ADATA and BDATA. ADATA and BDATA are identical except that BDATA is phase shifted by one quarter of a cycle as compared to ADATA. ADATA and BDATA are applied as data inputs to a digital transversal filter which in this embodiment comprises a pair of delay lines formed by shift registers 14, 16. Each of the shift registers 14, 16 is clocked by a respective clocking signal 2XCLK, 2XCLK* generated by a clock circuit 18. 2XCLK* is phase shifted by 180° with respect to 2XCLK, and has a frequency equal to twice the data clocking frequency of ADATA and BDATA. In general, the delay line clocking rate defined by the clock signals should be greater than the data clocking rate of ADATA and BDATA by a factor of N, where N is a positive integer power of 2. N is equal to 2 in this case. In this embodiment, each of the shift registers 14, 16 includes twelve stages, and the digital signals ADATA, BDATA are shifted progressively through the twelve stages of the shift registers 14, 16 at a rate determined by the clocking signals 2XCLK, 2XCLK*.

Each of the twelve stages of the shift registers 14, 16 has a respective output terminal, and these output terminals are connected in parallel to resistor banks 20, 22. Each of the resistor banks 20, 22 has up to twelve separate resistors, each interconnected between a summing node 24 and a respective one of the output terminals of the respective shift register 14, 16. The signal synthesized at the summing node 24 includes components associated with various output stages of the shift registers 14, 16, weighted by weighting factors determined by the values of the resistors in the resistor banks 20, 22. This synthesized signal at the summing node 24 is then applied as an input to a transmitter line driver 26, which generates transmitted pulses on a transmission medium 28 in response thereto.

FIGS. 2A through 2H provide a detailed schematic diagram of the presently preferred embodiment of the transmitter 10, and FIGS. 3A and 3B provide timing diagrams for selected signals related to this schematic diagram.

Turning to these figures, the clock circuit 18 generates four clock signals 1XICLK, 1XQCLK, 2XCLK, 2XCLK*, as shown in FIG. 3A. 1XQCLK is phase-shifted by 90 degrees with respect to 1XICLK, and 2XCLK* is phase-shifted by 180 degrees with respect to 2XCLK. The frequencies of 1XICLK and 1XQCLK are identical; the frequencies of 2XCLK and 2XCLK* are identical; and the frequency of 2XCLK is twice that of 1XICLK. In this embodiment, the frequency of 2XCLK is 40.96 MHz.

The data input to the transmitter 10 is labeled XMTBIT in FIG. 2A. In this embodiment, XMTBIT is not allowed to change state between the rising edge of 1XICLK and the rising edge of 1XQCLK. The rate at which bits are transmitted on the medium 28 for this particular embodiment is 20 MBS. The differential encoder and phase shifter 12 is implemented in FIG. 2B with an EXOR gate 30 and a pair of D flip-flops 32, 34. The EXOR gate 30 and the flip-flop 34 form a differential encoder, which further encodes the data so that the output is complemented if the input is a binary zero and the output is left unchanged if the input is a binary one. The Q outputs of the flip-flops 32, 34 are the binary signals ADATA and BDATA described above. As shown in FIG. 3A, these signals are identical to one another except that BDATA is delayed by one-quarter of a cycle with respect to ADATA. FIG. 3A shows the manner in which both ADATA and BDATA are differentially encoded as described above. In general, the phase delay between BDATA and ADATA should be 1/M of a cycle of the digital data signal, where M is a positive power of 2. In this embodiment, M equals 4.

The data signals ADATA and BDATA are applied to the shift registers 14, 16 respectively. These shift registers form a binary transversal filter which provides a digital means by which different complex analog pulse shapes may be synthesized by using a stair step approximation method. The shift registers 14, 16 are clocked by the clock signals 2XCLK and 2XCLK*, respectively, at twice the data rate of the data signals ADATA and BDATA.

FIG. 3B is a timing diagram showing the manner in which ADATA and BDATA of FIG. 3A are clocked through initial stages of the shift registers 14, 16, respectively. In particular, FIG. 3B shows the Q1, Q2, Q3 and Q4 outputs of the circuits 36, 38 of the shift registers 14, 16, respectively. The differential encoding of the transmitted data stream is clearly shown in FIG. 3B. When the combined result of both shift registers 14, 16 is considered, it is clear that there are a total of 24 representations of the data stream, each delayed from the previous one by one-fourth of the bit interval. Thus, the 24 stages of the shift registers 14, 16 when taken together represent a total of 6 bit cycles of the data stream being transmitted.

The outputs of the shift registers 14, 16 are connected to respective resistors 40 in the resistor banks 20, 22. Both the Q and the Q-bar output terminals of the stages of the shift registers 14, 16 are available, and suitable jumpers 42 can be used to select either the Q or the Q-bar output of each stage for connection to the respective resistor 40.

The resistors 40 are interposed between the summing node 24 and the respective outputs of the shift registers 14, 16. In effect, the resistors 40 define weighting factors which determine the contribution of the respective stages of the shift registers 14, 16 to the composite synthesized signal generated at the summing node 24.

This composite signal is then applied as an input to the transmitter line driver 26. The transmitter line driver 26 includes a low pass filter, sometimes referred to as a splatter filter. The main purpose of this filter is to smooth out the steps in the staircase wave form generated at the summing node 24 so that the transmitted signal is smoother and more nearly continuous. This splatter filter also aids in attenuating the side lobes of the transmitted spectrum.

Table 1 defines the presently preferred values for the resistors 40 of the resistor banks 20, 22 of this preferred embodiment.

TABLE 1

| Resistor Bank | Resistor No. | Resistance (ohms) |
| --- | --- | --- |
| 20 | 1 | 100K |
|  | 2 | 4.75K |
|  | 3 | 2.67K |
|  | 4 | 7.50K |
|  | 5 | 20.0K |
|  | 6 | INF. |
|  | 7 | 49.9K |
|  | 8 | INF. |
|  | 9 | 30.1K |
|  | 10 | 18.2K |
|  | 11 | INF. |
|  | 12 | 3.32K |
| 22 | 1 | 2.37 |
|  | 2 | 5.11K |
|  | 3 | 10.0K |
|  | 4 | 16.2K |
|  | 5 | 8.25K |
|  | 6 | INF. |
|  | 7 | INF. |
|  | 8 | 12.1K |
|  | 9 | 22.1K |
|  | 10 | 7.50K |
|  | 11 | 49.9K |
|  | 12 | 3.92K |

Resistors 1-12 of resistor bank 20 are connected to stages 1-12 of the shift register 14, respectively, and resistors 1-12 of the resistor bank 22 are connected to stages 1-12 of the shift register 16, respectively.

The transmitter 10 is designed to transmit time compressed duobinary transmitted pulses or predistorted versions thereof. The following equation defines the conventional time compressed duobinary pulse:

$$H(t) = A(2T/3)^2 \sin(3\pi t/2T)/\pi t((2T/3) - t).$$

Figure 4A:
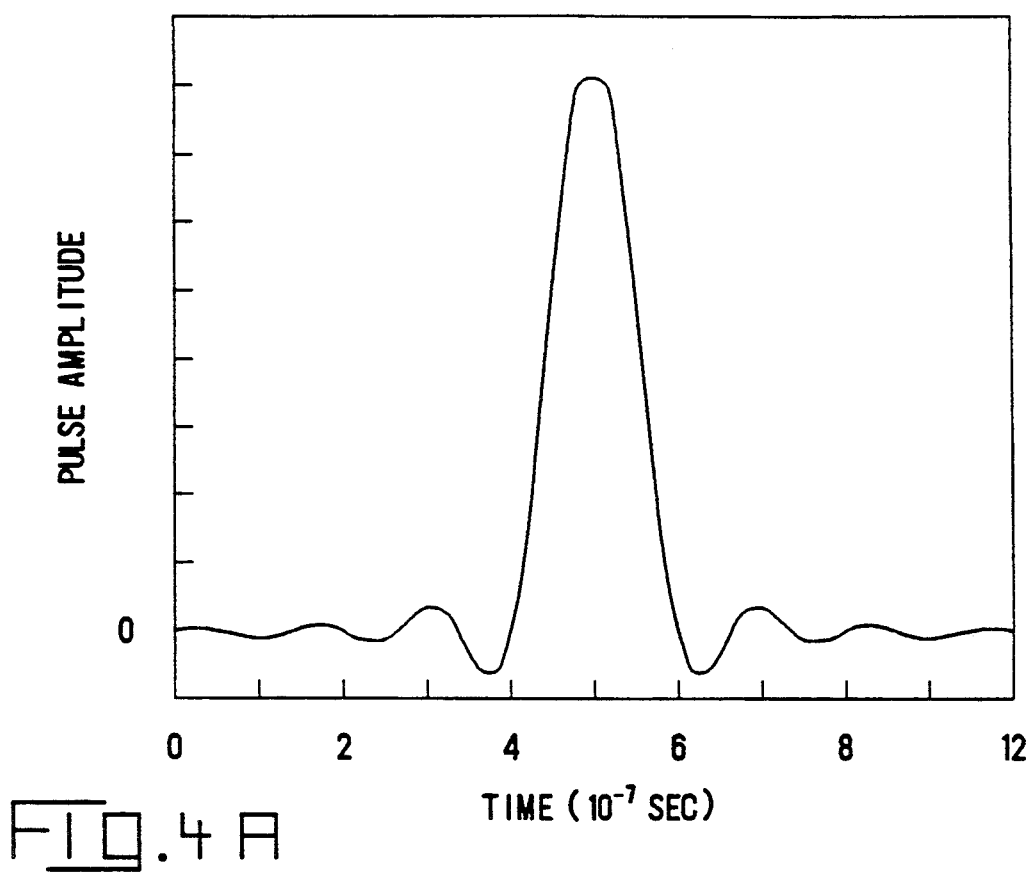
FIGS. 4A and 4B are waveform diagrams used to illustrate the operation of the transmitter of FIG. 1.
Figure 4B:
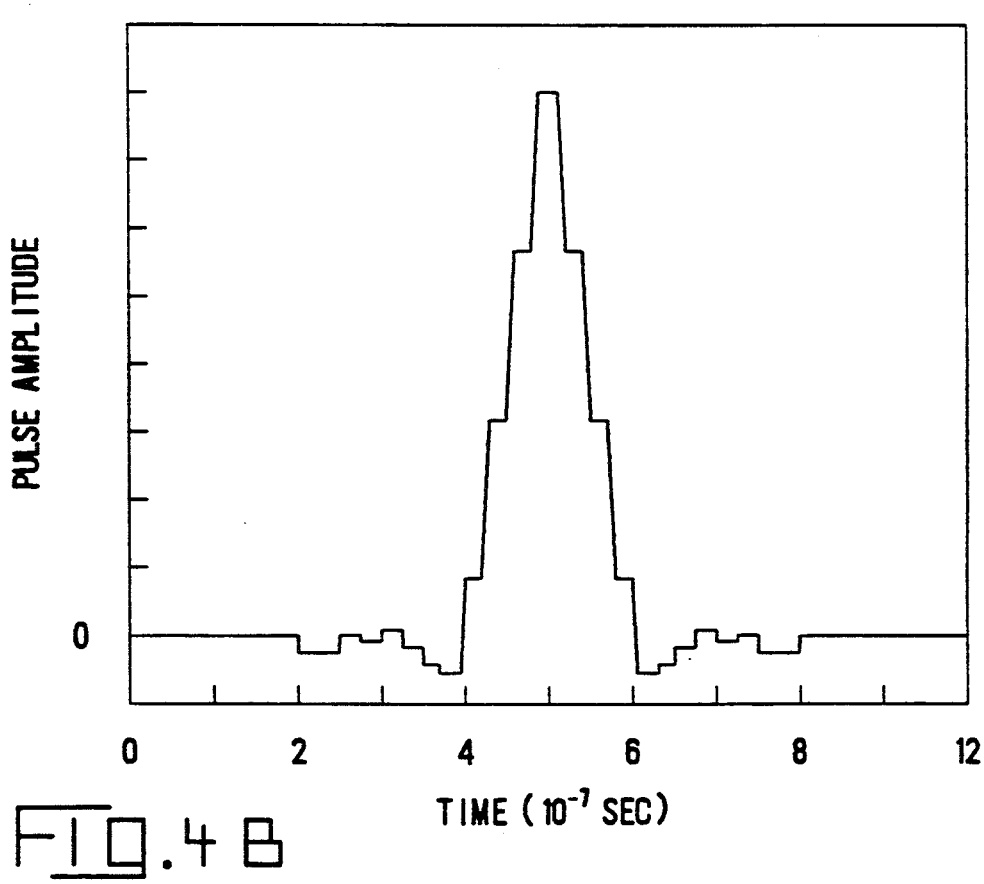

As discussed in the above-identified related applications, the transmitter 10 can operate to predistort the transmitted pulse in order to improve the correspondence between the pulse as actually received by a receiver, after transmission through a metallic transmission medium, and the ideal, predetermined pulse which the receiver is designed to receive optimally. FIG. 4A shows a waveform diagram of a compressed duobinary pulse, and FIG. 4B shows a stair step approximation of this pulse which can be generated with the shift registers 12, 14 and the resistors 40 of FIG. 2A through 2R. The resistor values given in Table 1 have actually been selected to predistort the transmitted pulse to optimize reception after transmission through 400 feet of twisted pair cable.

In the transmitter 10, the desired transmitted pulse waveform is approximated by means of the shift registers 14, 16, the resistor banks 20, 22, the summing node 24 and the transmitter line driver 26. The purpose of the shift registers 14, 16 is to provide the capability of switching various resistors of the resistor banks 20, 22 either high or low at quarter bit intervals. Once switched, the shortest time interval that a particular resistor can be held high or low is equal to one bit interval, and the pulses from the various resistors therefore overlap in time. Thus, as a bit in the ADATA and BDATA data streams is shifted through the shift register 14, 16, the bit switches the 24 resistors of the resistor banks 20, 22 either high or low, thereby providing either a positive or negative contribution to the synthesized signal generated at the summing node 24, with a weighting factor determined by the resistance of the respective resistor. As pointed out above, the shift registers 14, 16 are clocked 180° out of phase with a clocking frequency two times that of the data clocking frequency. Furthermore, BDATA is phase shifted by 90° with respect to ADATA. This causes a differentially encoded single bit from the input signal XMTBIT to ripple through the 24 output stages of the shift registers 14, 16 in the order indicated by the letters A-ZA of FIG. 2B, 2C and 2G. The weighting factors provided by the resistors 40 may be selected to predistort the transmittal signal as described above to produce the ideal pulse shape at the receiver comparator.

Thus, the shift registers 14, 16 and resistor banks 20, 22 simultaneously perform two separate functions. First, they transform the squarewave ADATA, BDATA signals into complex analog waveforms having bits overlapping in time and smooth transitions well suited for transmission on the twisted pair transmission medium 28. Second, they optionally predistort the shape of the transmitted pulses to correct for the distortion of the transmission medium 28. The second, predistortion function is obtained merely by properly choosing the values of the resistors 40, without any significant increase in the cost or complexity of the transmitter 10.

The shift registers 14, 16 form a delay line which cycles at 4 times the data bit rate, even though the clocking rate of the individual shift registers 14, 16 is only two times the data clocking rate. By eliminating the need for shift registers operating at a clocking rate of four times the data clocking rate, the choice of suitable circuity is increased.

Further theoretical details regarding the design and operation of the transmitter 10 are provided in the following documents, which are hereby incorporated into this specification by reference:

1. IEEE 802.9-90/7 "Theory and Practice of Non-Return to Zero Sinusoidal Transition Modulation with Line Compensation at the Transmitter", Jan. 11, 1990;
2. IEEE 802.9-90/8 "Offered Draft Text for Physical Medium Portion of 802.9 Standard Including 16 MBS on UTTP", Jan. 12, 1990;
3. IEEE 802.9-90/22 "Computer Analysis and Test Results of NRZST Impulse Noise and Crosstalk Rejection Characteristics", Mar. 8, 1990.

Though the transmitter 10 represent the presently preferred embodiment, it should be apparent that a wide variety of changes and modifications to this preferred embodiment are possible. For example, more than two shift registers may be used if desired, and the delay line clocking rate may be more than two times the data clocking rate. Additionally, the values of the resistors may be selected as described above to provide a wide range of transmitted pulse shapes, and this invention is not limited to use with compressed duobinary pulses as described above and predistortions thereof. Furthermore, the digital transversal filter described above is not limited to use in modem transmitters, but may find wide acceptance in other applications.

It is therefore intended that the foregoing detailed description be regarded as illustrative rather than limiting, and that it be understood that it is the following claims, including all equivalents, which are intended to define the scope of this invention.

What is claimed is:

1. A digital transversal filter comprising:

first and second delay lines, each having a data input terminal, a clock input terminal, and a plurality of stages, wherein, for each of the delay lines, at least two adjacent stages of the respective delay line are clocked by a clock signal applied to the respective clock input terminal to shift digital data through the respective delay line, at least selected stages of the delay line each providing a respective output;

means for applying a digital data signal to the data input terminal of the first delay line;

means for phase shifting the digital data signal to form a phase shifted digital data signal and applying the phase shifted digital data signal to the data input terminal of the second delay line;

means for applying first and second clock signals to the clock input terminals of the first and second delay lines, respectively, wherein the first and second clock signals correspond in frequency but differ in phase with respect to one another;

means for weighting the outputs of the stages of the first and second delay lines; and means for summing the weighted outputs of the stages of the first and second delay lines to synthesize a summed output;

said first mentioned digital data signal having a data clocking rate, said first and second clock signals having a delay line clocking rate, and said data clocking rate being slower than said delay line clocking rate.

2. The invention of claim 1 wherein the second clock signal is 180 degrees out of phase with respect to the first clock signal.

3. The invention of claim 1 wherein the delay line clocking rate is greater than the data clocking rate by a factor of N, where N is equal to a positive integrator power of 2.

4. The invention of claim 3 wherein the phase shifted digital data signal is phase shifted with respect to the digital data signal by a fraction 1/M of a digital data signal cycle, where M is a positive integer power of 2.

5. The invention of claim 4 wherein N is less than M.

6. The invention of claim 4 wherein N equals 2 and M equals 4.

7. The invention of claim 1 wherein each of the delay lines comprises a respective shift register.

8. The invention of claim 1 wherein the digital data signal is a binary data signal, and wherein the output of each of the stages is a respective binary output signal.

9. The invention of claim 1 wherein the means for weighting the outputs of the stages of the first and second delay lines comprises a plurality of resistors, each of the resistors connected to a respective one of the outputs of the stages.

10. The invention of claim 9 wherein the means for summing the weighted outputs comprises a summing node connected to the plurality of resistors.

11. The invention of claim 1 wherein the means for phase shifting the digital data signal comprises means for delaying the digital data signal to form a phase shifted digital data signal.

12. The invention of claim 1 further comprising means for transmitting a signal derived from the summed output on a transmission medium.

13. The invention of claim 12 wherein the digital data signal is characterized by a bit rate in excess of 10 MBS.

14. A binary transversal filter for processing a binary data signal, said binary transversal filter comprising:
   first and second shift registers, each having a data input terminal, a clock input terminal, and a plurality of data output terminals, each of said shift registers operative to shift digital data through the respective shift register in response to a signal applied to the respective clock input terminal;
   means for applying a binary data signal to the data input terminal of the first shift register;
   means for delaying the binary data signal by 360 degrees/M to form a delayed data signal and applying the delayed data signal to the data input terminal of the second shift register, where M is a positive integer power of 2;
   means for applying first and second clock signals to the clock input terminals of the first and second shift registers, respectively, wherein the first and second clock signals are out of phase by 180 degrees, and wherein the clock signals have a frequency which is greater than that of the binary data signals by a factor of N, where N is a positive integer power of 2;
   a summing node; and
   a plurality of resistors, each connected between the summing node and a respective one of the data output terminals.

15. The invention of claim 14 wherein N is less than M.

16. The invention of claim 14 wherein N equals 2 and M equals 4.

17. The invention of claim 14 wherein the binary data signal is characterized by a bit rate in excess of 10 MBS.

18. The invention of claim 14 further comprising means, coupled to receive an input signal from the summing node, for processing the input signal to form a transmitted signal and applying the transmitted signal to a transmission medium.

19. The invention of claim 18 wherein the digital data signal is characterized by a bit rate in excess of 10 MBS.

* * * * *